United States Patent [19]

Williams

[11] Patent Number: 5,749,469
[45] Date of Patent: May 12, 1998

[54] WAFER CARRIER

[75] Inventor: Randall S. Williams, Chaska, Minn.

[73] Assignee: Fluoroware, Inc., Chaska, Minn.

[21] Appl. No.: 480,692

[22] Filed: Jun. 7, 1995

Related U.S. Application Data

[63] Continuation-in-part of Ser. No. 251,017, May 31, 1994, abandoned, which is a continuation of Ser. No. 883,181, May 15, 1992, abandoned.

[51] Int. Cl.⁶ .................................................. B65D 85/30
[52] U.S. Cl. .................... 206/710; 206/454; 294/31.1; 294/33
[58] Field of Search .................................. 206/710, 711, 206/712, 445, 454; 211/41; 118/500; 294/27.1, 33, 31.1; 414/DIG. 1, DIG. 7

[56] References Cited

U.S. PATENT DOCUMENTS

| | | |
|---|---|---|
| 3,918,756 | 11/1975 | Saville et al. . |
| 3,930,684 | 1/1976 | Lasch, Jr. et al. . |
| 3,949,891 | 4/1976 | Butler et al. . |
| 3,961,877 | 6/1976 | Johnson . |
| 4,532,970 | 8/1985 | Tullis et al. . |
| 4,582,219 | 4/1986 | Mortensen et al. . |
| 4,684,021 | 8/1987 | Niebling et al. . |
| 4,705,444 | 11/1987 | Tullis et al. . |
| 4,709,834 | 12/1987 | Mortensen et al. . |
| 4,715,637 | 12/1987 | Hosoda et al. . |
| 4,739,882 | 4/1988 | Parikh et al. . |
| 4,752,007 | 6/1988 | Rossi et al. . |
| 4,815,912 | 3/1989 | Maney et al. . |
| 4,848,814 | 7/1989 | Suzoli et al. . |
| 4,859,137 | 8/1989 | Bonora et al. . |
| 5,025,924 | 6/1991 | Watanube . |
| 5,042,655 | 8/1991 | Beldyk et al. ............... 206/454 X |
| 5,054,418 | 10/1991 | Thompson et al. . |
| 5,061,144 | 10/1991 | Akimoto et al. . |

FOREIGN PATENT DOCUMENTS 3151480  12/1981  Germany .

OTHER PUBLICATIONS

SMIF And Its Impact On Cleanroom Automation, by Shanti Gunawardena, et al, "Microcontamination" Sep., 1985, pp. 56–62, 108, 8 and 10.

Primary Examiner—Jacob K. Ackun
Attorney, Agent, or Firm—Palmatier, Sjoquist, Helget & Voigt, P.A.

[57] ABSTRACT

A container for semiconductor wafers is disclosed which has a multiplicity of C-shaped wafer holders for individually securing each wafer. Each wafer holder has an open side for receiving and releasing wafers, a closed side with a support portion for supporting the wafer holder in the container. A pair of resilient arcuate arms, each with seating portions and manipulation arms, extend more than 180° around the wafer for retaining the wafers in any orientation.

12 Claims, 5 Drawing Sheets

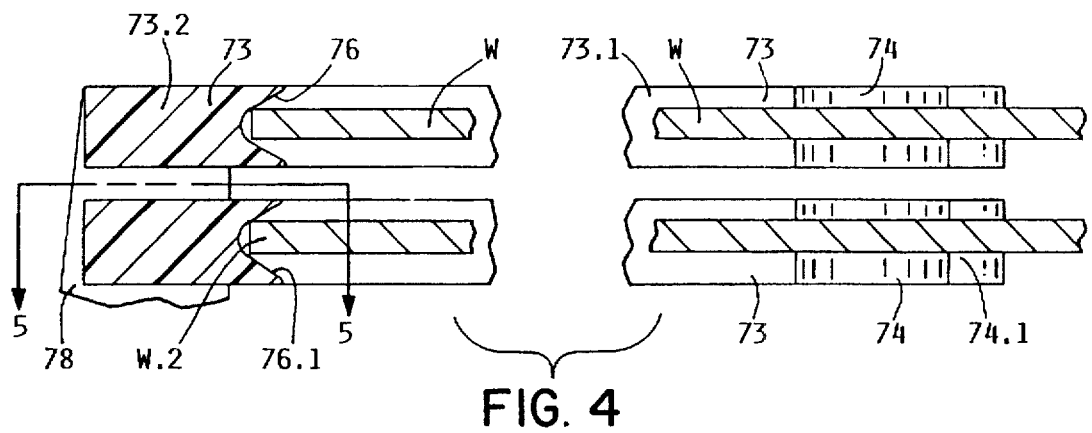
FIG. 4
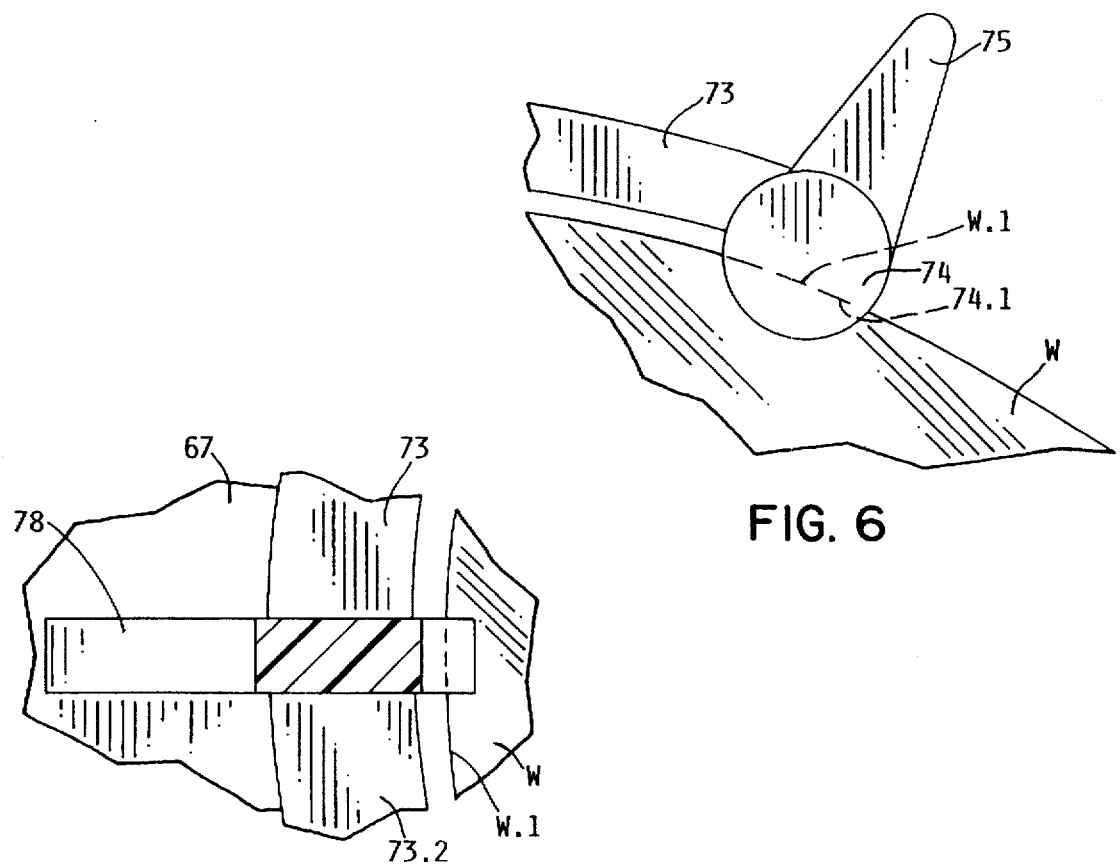
FIG. 6
FIG. 5

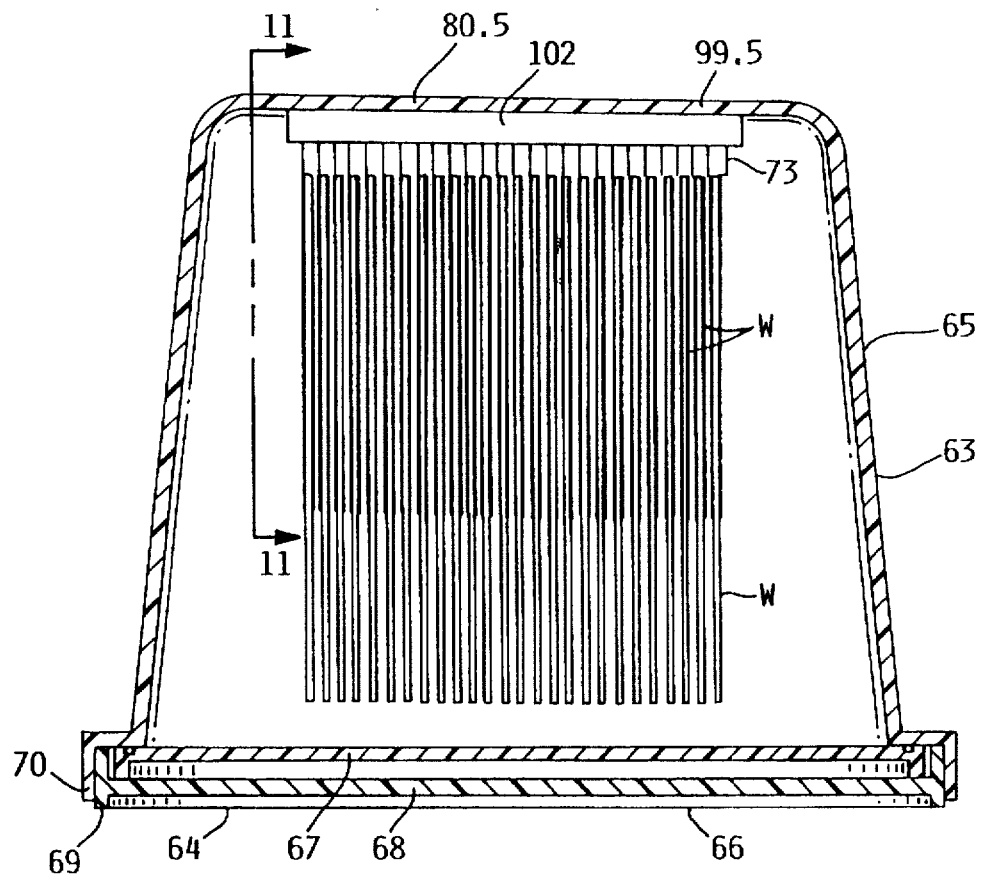
FIG. 10
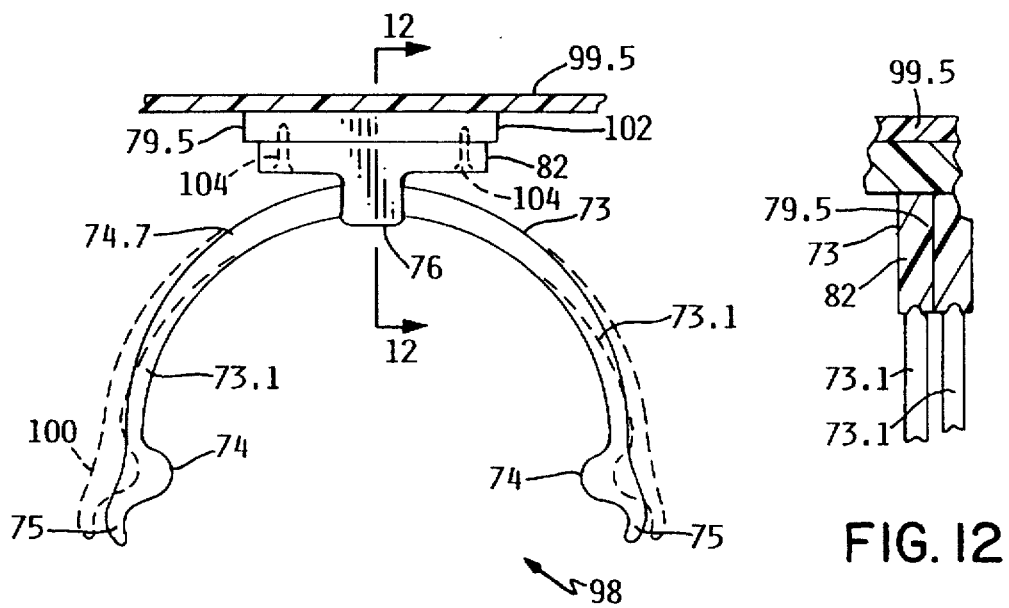
FIG. 11
FIG. 12

WAFER CARRIER

This is a continuation-in-part of application Ser. No. 08/251,017 filed May 31, 1994, now abandoned, which was a continuation of application Ser. No. 883,181, filed May 15, 1992, now abandoned.

This invention relates to open and closeable carriers and containers for storing, transporting, and processing semiconductor wafers. More particularly the invention relates to containers or carriers with moveable ribs for retaining semiconductor wafers.

BACKGROUND OF THE INVENTION

In the processing of semiconductor wafers, there is a clear relation between chip yield and particle contamination, as the yield decreases when particle contamination increases. Concern for particle contamination is increased because finer geometries of the circuit lines on a chip may allow particles of smaller and smaller sizes to cause contamination. Furthermore, the density of particles in a cleanroom may increase dramatically as the size of the contaminating particles decreases.

More and more the nature and functionality in confining containers for semiconductor wafers becomes extremely important in order to efficiently supply semiconductor wafers to processing equipment easily, while minimizing the possibility of allowing introduction of contaminating particles.

Semiconductor wafers are generally circular in shape and very thin to the extent they can be characterized as planar. Handling wafers by the edges is desirable to prevent damage or contamination to the wafers. Known semiconductor wafer carriers and containers in which the wafers are accessible for removal, such as for processing, have relied primarily on gravity to retain the wafers in the carriers. Moreover, known carriers and containers in which the wafers may be oriented in any position do not have accessibility to the wafers without removal of a cover or other retaining means.

SUMMARY OF THE INVENTION

An object of the invention is to provide a new and improved container or carrier for semiconductor wafers with wafer retention that is not dependant on the orientation of the container or carrier.

A feature and advantage of the invention is that the C-shaped holders retain, support, and present the wafers in any orientation while still allowing accessibility to the wafers.

A feature of the invention is a wafer carrier which retains the wafers against movement and thereby minimizes generation of particles during wafer storage, and whereby the container is readily and easily manipulable as to permit easily opening and closing the container and moving portions of the container to an out-of-the-way position in order to obtain access to the wafers.

BRIEF DESCRIPTION OF THE DRAWINGS

FIG. 4 is an enlarged detail section view taken approximately at 4—4 of FIG. 2.

FIG. 5 is a detail section view taken approximately at 5—5 of FIG. 4.

FIG. 6 is a detail elevation view of one of the wafer engaging seat portions of FIG. 4.

FIG. 10 is an elevational sectional view of a different embodiment of a wafer container.

FIG. 11 is a partial sectional view taken at line 11—11 of FIG. 10.

FIG. 12 is a partial sectional view taken at line 12—12 of FIG. 11 and shows a detail of the support portions of wafer holders.

DETAILED SPECIFICATION

Figure 1:
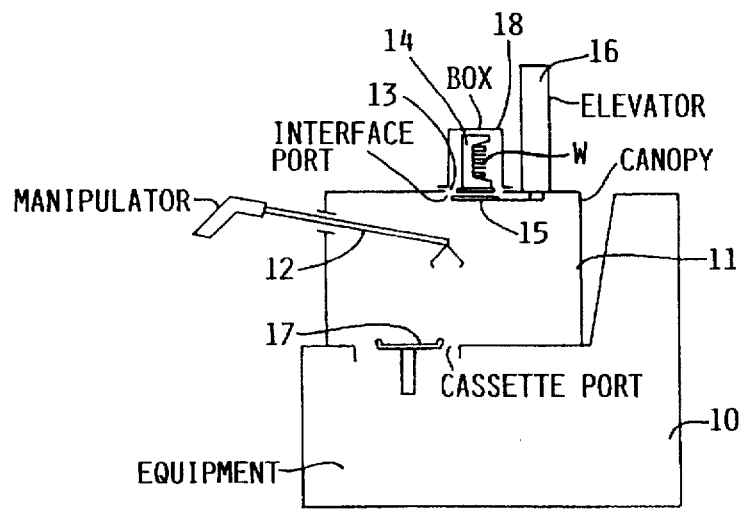
FIG. 1 is a diagrammatic view illustrating prior art supplying of semiconductor wafers into processing equipment through an enclosing canopy and showing wafers in a conventional carrier.

A piece of equipment is illustrated in FIG. 1 at numeral 10 for processing semiconductor wafers in one of the many steps required in the production of circuit chips. Typical of such process steps may be etching of oxide of the wafers, or application of photoresist or rinsing and drying, etc. It has been rather common in the past to provide a canopy 11 on the equipment or machine 10 and some type of manipulator 12 for handling wafer cassettes or containers being supplied to the equipment. The canopy 11 typically has an interface port or opening 13 through which semiconductor wafers W, confined in a cassette 14, are supplied through the canopy and into the interior of the canopy for feeding into the processing equipment. The interface port is typically closed by a door or closure 15 which serves to support the cassette or carrier 14; and the closure 15 is connected to an elevator 16 for lowering the cassette or carrier 14 into the interior of the canopy. The manipulator arm 12 may be operated to lift the carrier or cassette 14 off the door 15 and place the wafers and their carrier onto another platform 17 for delivery into the processing equipment.

A box 18, which has previously been known as a SMIF box, fits over the interface port and delivers the cassette or carrier 14 of the wafers W to the canopy for delivery into the equipment 10. The box 18 has a receptacle portion which may rest upon the canopy adjacent the port 13; and a cover which may rest upon the door 15. The box 18 is useful for the purpose of minimizing the selection of airborne particles and similar contaminants onto the wafers as the wafers are being supplied into or removed from the equipment 10. The wafers W are aligned coaxially and horizontally whereby the wafers W are removed from the carrier 14 in a horizontal or edgewise manner coplanar with the orientation in the carrier.

The acronym SMIF refers to a STANDARD MECHANICAL INTERFACE, referring to the relationship between the box and the canopy.

In FIGS. 2–6, a semiconductor wafer storage container, such as a SMIF box, is indicated in general by numeral 62 and comprises a two-part molded plastic box 63 with a flat side portion 64 which may form the bottom of the box. The box 63 includes a receptacle portion 65 and a cover portion 66. The cover portion 66 comprises a closure panel 67 and a retainer panel 68 retained by a quarter turn thread 69 in the peripheral portion 70 of the receptacle portion 65. It will be seen that the peripheral portion 70 of the closure panel 67 lies against an annular shoulder 70.1 of the receptacle periphery; and the retainer panel 68 is also seated against the shoulder portion 70.1 and supports the annular periphery or flange 71 of the closure panel.

Figure 2:
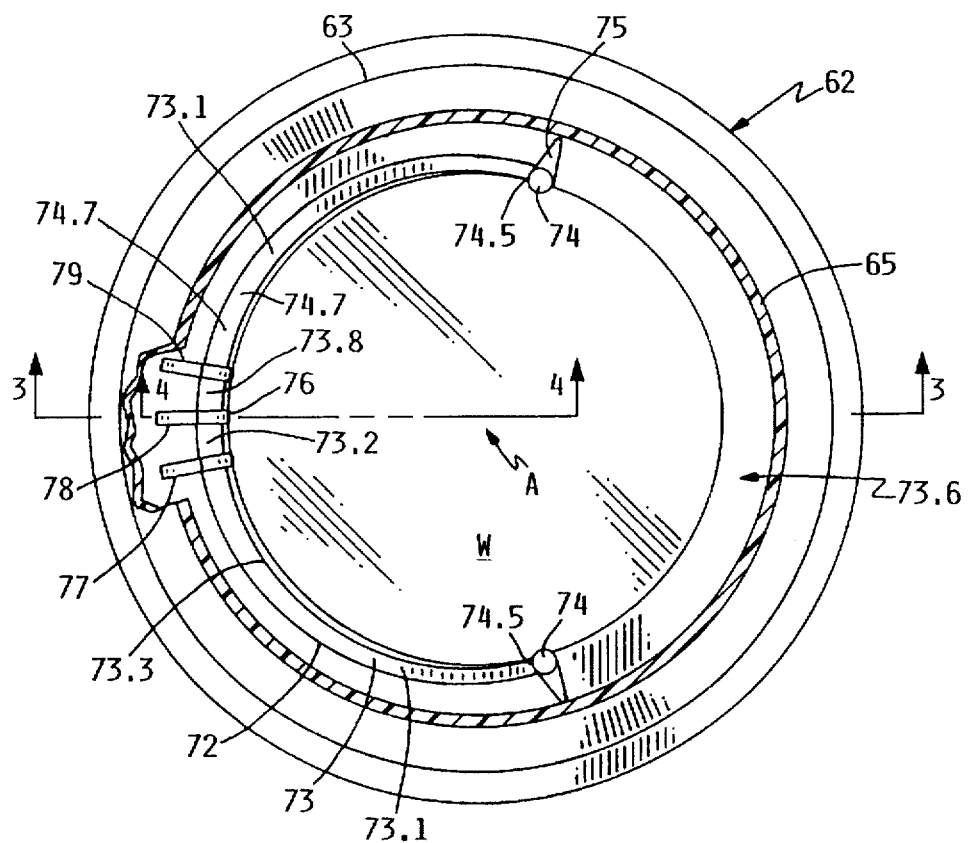
FIG. 2 is a section view of another modified form of a semiconductor wafer storage container, the section being taken generally at line 2—2 of FIG. 3.
Figure 3:
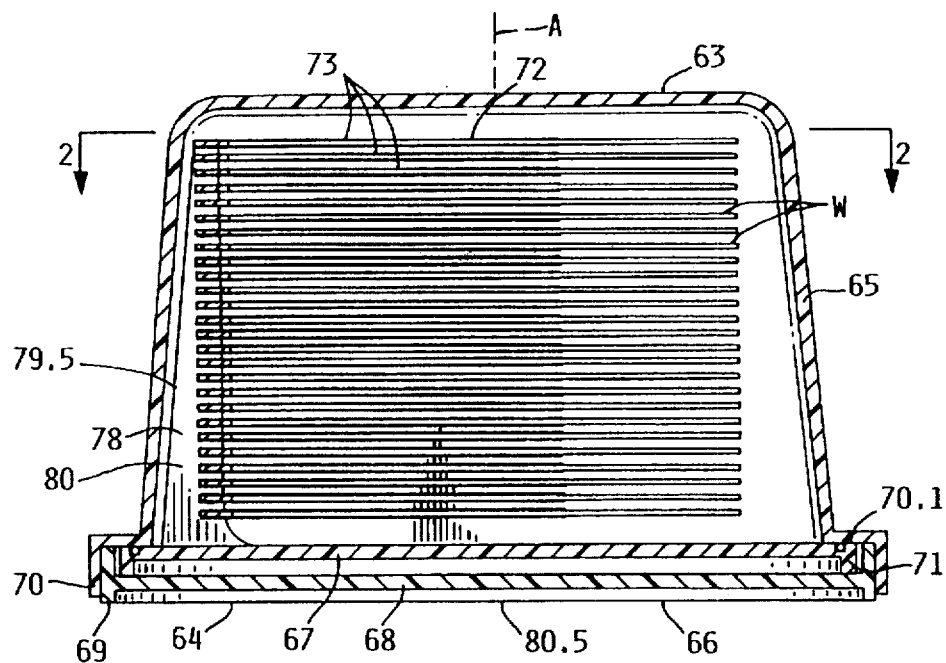
FIG. 3 is a section view of a wafer storage container illustrated in FIG. 2 and taken approximately at 3—3 of FIG. 2.

The container 62 also comprises stationary engaging means 72 for engaging the peripheries W.1 of the semiconductor wafers W and retaining the wafers against edgeways movements in the planes of the wafers. The engaging means 72 comprise a plurality of C-shaped wafer holders 73 which extend around the peripheries W.1 of the wafers. As best illustrated in FIG. 2. the holders 73 have resilient yieldable arm portions 73.1 and an intermediate portion 73.2. The holders 83 each have a first open side 73.6 for receiving or releasing wafers W and an opposite second side 73.7 with a support portion 73.8 for supporting the holders 73. The arm portions 73.1 have notched or grooved wafer seating and retaining portions 74 at their opposite outer ends 74.5. The arm portions 83.1 and the intermediate portion constitute an expandable retaining portion 74.7. The retaining portions 74.7. and particularly the arm portions 73.1, closely follow the peripheries W.1 and edge portions W.2 of the wafers W and are arcuately shaped, and are also resiliently yieldable to spring slightly outwardly to release the wafers when outward pressure is applied onto the manipulating handles 75. The C-shaped wafer holders 73 define a partially circular interior edge 73.3, and it will be recognized that the partially circular interior edge 73.3 is shaped greater than a semicircle. Each of the seating portions 74 urge the circular wafer W against the other seating portion 74 and against the seating portion 76. As seen in FIG. 5, the seating portions 74 on the arm portions 73.1 and the seating portion 76 on the intermediate portion 73.2 define the actual circular boundaries of the partially circular open interior portion 73.3. As shown in FIGS. 4 and 5, the notches 74.1, 76.1 in seating portions 74 and in seating portions 76, are oriented intermediate the thicknesses of the arm portions 73.1 and the intermediate portions 73.2 to seat the edge portions W.2 and the periphery W.1 of the wafer. The wafer holders 73 and the wafers when in the retained position of FIGS. 2 and 3 have a common axis A.

The multiplicity of C-shaped wafer holders 73 are affixed to and supported on three posts 77, 78 and 79 constituting a spine 79.5 which protrude upwardly and is affixed to the stationary cover panel 67. The wafer holders 73 are thus attached to the box 63 at the cover portion 66.

When the wafers are to be removed from the box 63. the retainer panel 68 will be revolved in its own plane through a quarter turn to be released from the adjacent periphery 70 of the receptacle, and then the retainer panel 68 and the cover panel 67 may simply be lowered out of the receptacle 65. carrying the wafers W therewith. To release each wafer W. each respective wafer carrier 73 must have its arm portions 73.1 flexed outwardly whereby the wafer may be horizontally withdrawn as discussed in greater detail below with reference to FIGS. 8 and 9. The cover portion 66 with the spine 79.5 and the holders 73 constitute a wafer carrier 80. The cover portion 66 functions as a base 80.5 for placing the carrier on something.

Figure 7:
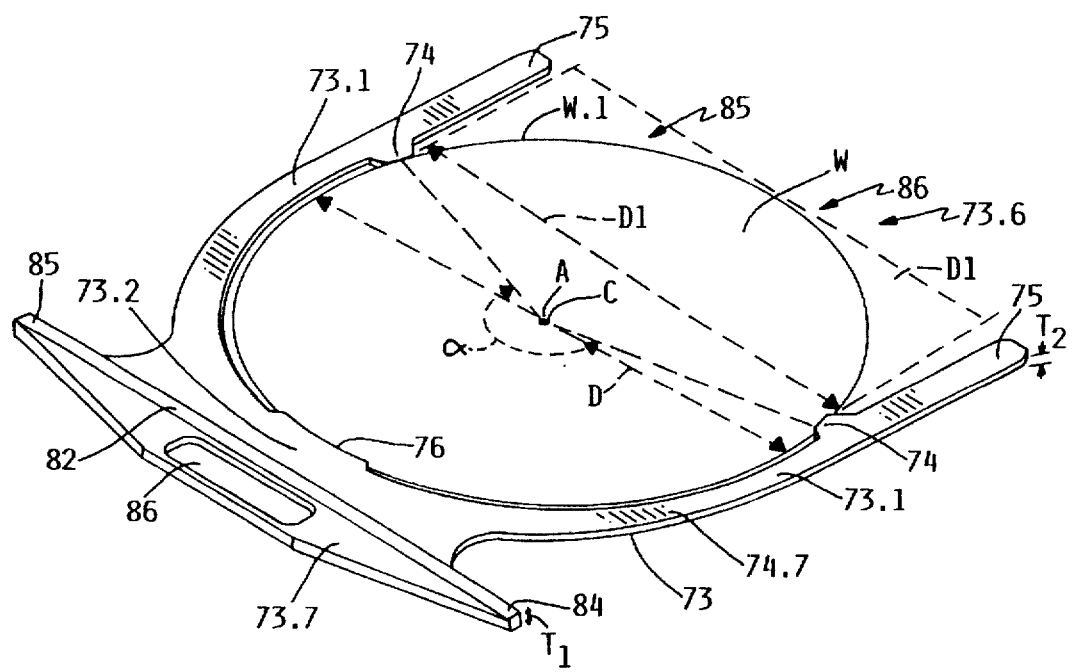
FIG. 7 is a perspective view of a C-shaped wafer holder with tangentially extending manipulation arms.

Referring to FIG. 7, an alternative embodiment of a C-shaped wafer gripping portion is shown. This embodiment has a support portion 82 on the second side which includes extension portions 84, 85 and an aperture 86. The support portion 82 may be utilized for attachment to a container or carrier. Alternately, individual wafers may be transported by utilizing the support portions 82 to grip the rib 73 either manually or by automated means. The support portion 82 has a thickness T1 which is greater than the thickness T2 of the arm portions 73.1 and the intermediate portions 73.2. and the wafer W. the wafer W has a diameter D and a center C. The wafer W is retained on its periphery W.1 by way of the seating portions 74 separated by a distance D1 which is less than the diameter D of the wafer W when the retaining portion when the wafer holder is in the retaining position. When the wafer holder is in the release position the distance D1 is greater then the diameter D of the wafer. Moreover, the holder 73 extends around and engages the periphery W.1 at three distinct points within an arc defined by angle α that is greater than 180°. The balance periphery is at the open side 73.6 When the wafers W are received or released through the open side 7 the plane of the wafer W and the outer ends 74.5 define an exit 85 or entrance 86.

The aperture 86 also alternately may be utilized as a hand grip or to facilitate gripping by an automated means for handling an individual wafer holder 73 which may be removed from a container or carrier.

Figure 9:
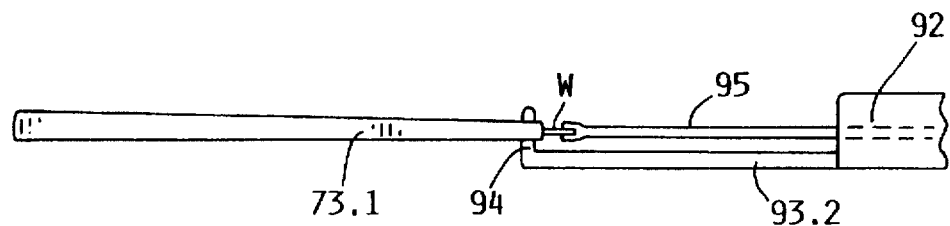
FIG. 9 is a side elevation view of the holder and end effector of FIG. 8.
Figure 8:
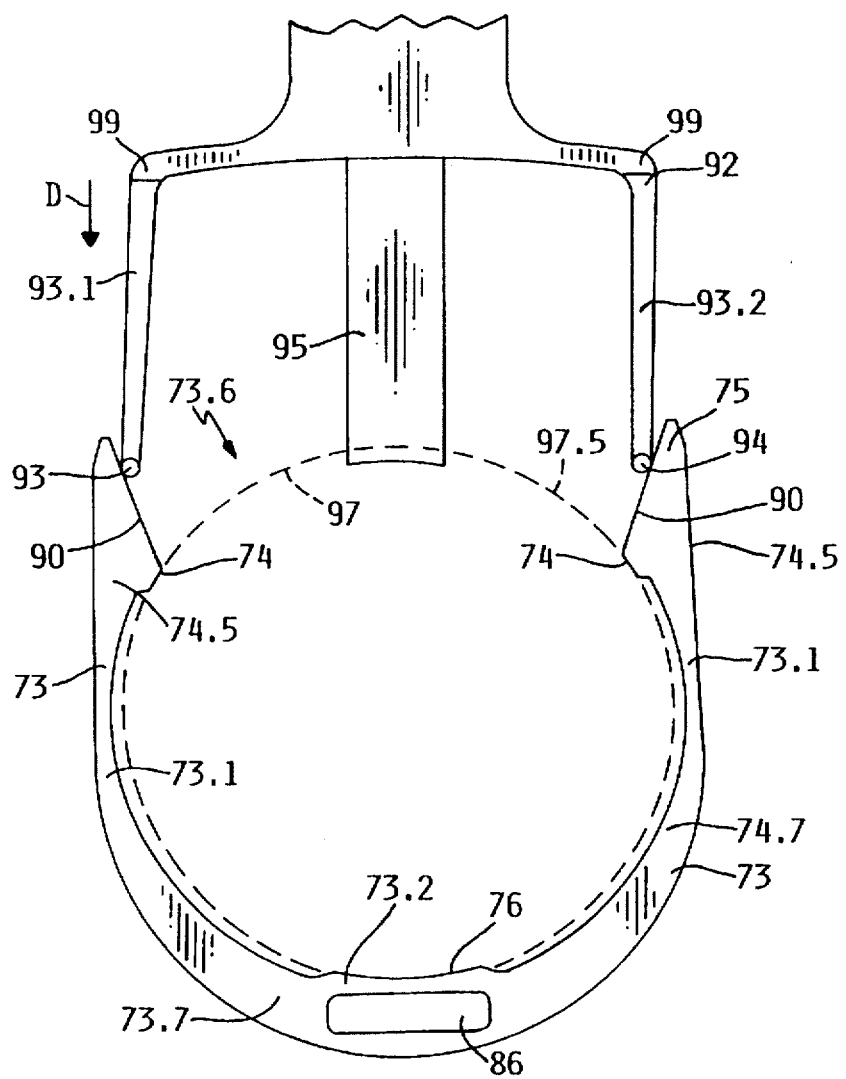
FIG. 8 is a top plan view of a further embodiment of a C-shaped wafer holder and an end effector to open the holder.

Referring to FIGS. 8 and 9, an alternate embodiment of a wafer holder 73 is shown with manipulating handles 75 with angled engagement surfaces 90 which are being engaged by an end effector 92. The end effector 92 has contact portions 93, 94 on arms 93.1, 93.2 to engage said angled surfaces 90 to extend the rib or wafer gripping portion 73. As the end effector 92 is moved in the direction as indicated by the arrow D the arm portions expand and the engagement gripping member 95 of the end effector 92 grasps the edge 97 of the wafer W which is held in a wafer holding region defined by the dashed line identified with the numeral 97.5. The gripping member 95 then retracts with the wafer while the arm portions 73 are maintained in their expanded open position. After the wafer has been retracted sufficient to clear the wafer seating portions 76 and the manipulating handle 75 the contact portions 93, 94 may be removed from their engagement with the angled surfaces 90. The C-shaped wafer holder may also receive a wafer W in a like but opposite manner. The C-shaped wafer holder thus has a first open side 73.6 for receiving and releasing the wafer W co-planar with the wafer W in its retained positioned and also co-planar with the three seating portions 74, 76. The contact portions 93, 94 may be configured as rolling bearings to prevent scraping on the angled surfaces 90. Alternately the end effector may have arms which expand outwardly by pivoting at the corners 99 to expand the wafer holder arm portions 73.1 outwardly.

Referring to FIGS. 10, 11, and 12 an alternate embodiment of a semiconductor wafer storage or processing container in which the wafer holders 73 are attached to the top 99.5 of the receptacle 65 through a mounting block 102. The support portions 82 are attached to the mounting block 102 by the way of screws 104, adhesive, welding or by other suitable means.

FIG. 11 shows the wafer holder 73 and the arm portions 73 in the retaining position and a wafer release or receiving position indicated by the dashed lines and designated with the numeral 100.

Referring to FIG. 12, it is seen that the support portions 82 of the wafer holders are engaged with each other and they thus may together be considered to comprise the spine 79.5.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention. For example, although the C-shaped gripping members are shown in the context of SMIF boxes, it is apparent that the other types of carriers, containers, and boxes utilized in the semiconductor industry also are appropriate for utilizing the C-shaped holders.

We claim:

1. A closeable container for containing and retaining semiconductor wafers having a substantially circular peripheral edge, the container comprising:

a) a box comprised of a receptacle portion and a removable cover portion; and b) and a plurality of axially aligned C-shaped wafer holders each having an open side and an opposite closed side, the holders each engageable with the peripheral edge of one of the semiconductor wafers, the holders each comprised of an intermediate portion at the closed side and a pair of resilient discrete arcuate arm portions extending from the intermediate portion, the intermediate portions attached to and stationary with the plastic box, the arm portions flexible outwardly and having a retaining position and an expanded release position whereby a wafer may be retained within each wafer holder in the retaining position and received or released from each wafer holder in the release position.

2. The container of claim 1, wherein the intermediate portions are attached to and stationary with the cover portion.

3. The container of claim 1, wherein each intermediate portion has a grooved wafer supporting portion for receiving a portion of the peripheral edge of the semiconductor wafer and wherein each of said arcuate arm portions comprise outer end portions, each outer end portion having a grooved wafer retaining portion for engaging the peripheral edge of the semiconductor wafer.

4. The container of claim 2, wherein each of the arcuate arm portions comprise a handle portion extending outwardly, said handle portion being manipulatable for flexing said arm portions outwardly whereby the semiconductor wafer may be received and released.

5. The container of claim 2, wherein the intermediate portions of the C-shaped wafer holders are attached to the removable cover by way of a post.

6. The container of claim 1, wherein the intermediate portions are attached to and stationary with the receptacle portion.

7. A carrier for holding and retaining semiconductor wafers having a peripheral edge, the carrier comprising:

a) a receptacle portion with an open side; and b) and a plurality of axially aligned C-shaped wafer holders, the holders engageable with the peripheral edge of the semiconductor wafers, the holders each comprised of an intermediate portion, and a pair of resilient discrete arcuate arm portions with distal ends extending from the intermediate portion, said arm portions integral with said intermediate portions, the intermediate portions attached to and stationary with the receptacle portion, the arm portions extending around and defining a wafer retaining region, the arm portions flexible outwardly whereby a wafer may be received and then retained within each C-shaped portion.

8. The carrier of claim 7 further comprising a cover portion to cover the open side.

9. The carrier of claim 7, further comprising a wafer seating portion on the intermediate portion, a wafer seating portion on each of the arcuate arm portions, the wafer seating portions engageable with the periphery of the wafers on an arc extending along the periphery adjacent to the arm portions and the intermediate portions, the arc extending greater than 180 degrees.

10. A wafer carrier for holding and retaining semiconductors in any orientation, the semiconductor wafers having a circular periphery, the carrier comprising:

a) a base; and b) a plurality of C-shaped wafer holders each wafer holder having a support portion for attachment to the base, a resilient and expandable retaining portion connected to the support portion, the retaining portion extending around a wafer holding region, the retaining portion having three wafer seating portions for engaging the peripheral edge of the semiconductor wafers, the three wafer seating portions engageable with the semiconductor wafers on an arc exceeding 180 degrees, whereby the semiconductor wafers are receivable in and releasable from the wafer holding region only when the retaining portion is expanded, the support portions attached to the base.

11. A wafer carrier for holding and retaining semiconductors in any orientation, the semiconductor wafers having a circular periphery, the carrier comprising:

a) a base; and b) a plurality of C-shaped wafer holders each wafer holder having a support portion for attachment to the base, a resilient and expandable retaining portion connected to the support portion, the retaining portion extending around a wafer holding region, the retaining portion having opposing ends defining an open side for receiving the wafers into and releasing the wafers from the wafer holding region, the retaining portion having a wafer seating portions for engaging the peripheral edge of the semiconductor wafers, the retaining portion having a retaining position and an expanded release position, the retaining portion configured such that the open side has a distance across the opening less than the diameter of the wafers when the retaining portion is in the retaining position and a distance greater than the diameter of the wafers when in the release position, whereby the retaining portion must be expanded to the release position for releasing or receiving wafers, the support portions attached to the base.

12. The wafer carrier of claim 11 further comprising a pair of manipulation handles attached to the retaining portion adjacent to the open side for expanding the retaining portion from the retaining position to the release position.

* * * * *